United States Patent
Green et al.

(10) Patent No.: US 7,043,502 B1
(45) Date of Patent: May 9, 2006

(54) METHODOLOGY FOR JEDEC FILE REPAIR THROUGH COMPRESSION FIELD TECHNIQUES

(75) Inventors: David J. Green, Snohomish, WA (US); Sungyong Pak, Bothell, WA (US)

(73) Assignee: Cypress Semiconductor Corp., San Jose, CA (US)

( * ) Notice: Subject to any disclaimer, the term of this patent is extended or adjusted under 35 U.S.C. 154(b) by 432 days.

(21) Appl. No.: 09/992,652

(22) Filed: Nov. 16, 2001

Related U.S. Application Data

(63) Continuation-in-part of application No. 09/916,453, filed on Jul. 27, 2001.

(51) Int. Cl.
*G06F 17/30* (2006.01)

(52) U.S. Cl. .................. 707/200; 707/1; 707/100; 714/52; 714/53; 714/54

(58) Field of Classification Search ............. 341/106; 375/122, 240, 341; 707/8, 101, 1–6, 100, 707/102, 104.1, 200; 709/247, 201, 203, 709/229, 236, 205, 246, 231, 218; 714/1, 714/751, 752, 762, 733, 711, 727, 3, 5, 10, 714/49–54; 716/1, 11, 14, 17, 128; 326/38, 326/96, 40–41; 365/185.01; 712/27, 37, 712/39, 43, 213, 300; 370/477; 710/8, 11, 710/68, 305; 713/176, 177, 186, 201; 345/73, 345/771

See application file for complete search history.

(56) References Cited

U.S. PATENT DOCUMENTS

| | | | | |
|---|---|---|---|---|
| 4,730,348 A | * | 3/1988 | MacCrisken | 375/240 |
| 5,090,015 A | * | 2/1992 | Dabbish et al. | 714/733 |
| 5,128,871 A | | 7/1992 | Schmitz | 364/490 |
| 5,396,505 A | | 3/1995 | Freeman et al. | 371/57.1 |
| 5,396,595 A | * | 3/1995 | Standley | 710/68 |
| 5,635,855 A | * | 6/1997 | Tang | 326/38 |
| 5,805,862 A | | 9/1998 | Winter et al. | 703/15 |
| 6,121,903 A | * | 9/2000 | Kalkstein | 341/63 |
| 6,138,229 A | * | 10/2000 | Kucukcakar et al. | 712/37 |
| 6,177,892 B1 | * | 1/2001 | Ko | 341/106 |
| 6,255,848 B1 | | 7/2001 | Schultz et al. | 326/41 |
| 6,401,230 B1 | | 6/2002 | Ahanessians et al. | 716/1 |
| 6,446,145 B1 | * | 9/2002 | Har et al. | 710/68 |
| 6,487,709 B1 | * | 11/2002 | Keller et al. | 716/14 |
| 6,873,630 B1 | | 3/2005 | Muller et al. | 370/542 |

OTHER PUBLICATIONS

"The Data Compression Book, Second Edition", Mask Nelson and Jean-Loup Gailly, Nov. 1995, pp. 54-74.

JEDEC Standard JESD3-C, "Standard Data Transfer Format Between Data Preparation System and Programmable Logic Device Programmer", Jun. 1994, pp. 1-35.

Microsoft Computer Dictionary, Fifth Edition, pp. 277, 318, 391 and 425.

\* cited by examiner

*Primary Examiner*—Shahid Alam
*Assistant Examiner*—Fred Ehichioya
(74) *Attorney, Agent, or Firm*—Christopher P. Maiorana, PC

(57) ABSTRACT

A method of generating a file suitable for programming a programmable logic device. The method generally comprises the steps of (A) generating a programming item from a plurality of parameters that define a program for the programmable logic device; (B) compressing the programming item to present a compressed item; (C) storing the programming item in a programming field of the file in response to generating; and (D) storing the compressed item in a non-programming field of the file in response to compressing.

18 Claims, 7 Drawing Sheets

```
Generated by CyClocksRT R1.05.00

Modification Date: 7/23/2001
Comments:
Customer:
FAE:
License #: dj0dk7mb2ec-cc0fn0sp1sn Don't modify file contents after this line:
< Checksum: 74F47101
s NMF3344 f   10.000000  ;External Ref
f  300.000000  ;Pll3
# f  266.000000  ;Pll2
# f  300.000000  ;Pll1, 0x
# f  300.000000  ;Pll1, 1
# f  300.000000  ;Pll1, 2
# f  300.000000  ;Pll1, 3
# f  400.000000  ;Pll1, 4
# f  400.000000  ;Pll1, 5
# f  400.000000  ;Pll1, 6
# f  400.000000  ;Pll1, 7>

```
Generated by CyClocksRT R1.05.00

Modification Date: 9/25/2001
Comments:
Customer:
FAE:
License #: dg0dk7mb2ec-cc0fn0sp1sn Don't modify file contents after this line:
Compression ID <<
vaACLhW_F`PXXfDv>E]ZjaAELG_nMLHfDGDRfWC?LdVa[Z>E]ZjaAEoBQJ_]ZRn
JsrQGn?L?>eODLwB^aOXFHGbQ>LXQ>ngybO@nYkUS{[]umAz]}\mmh\kInutsT}}]@
>LngYPcF^i{ku\{}kTi{US{y>]}}}}}}}}}}?|}}}}}}}}}}Az}}}}}}}}}}Ev}}}}
}}}}}}Mn}}}}}}}}}}]^}}}}}}}}}}}>}}}}}}}}}}}?|{Uuu][Azymlm}xDvu][]}
sKnm}x||iY^]}s{{Uu>}|iyyml?|{Uuu][Azymlm}xDvu][]}sKnm}x||iY^]}s{{U
u>}|iyyml?|{Uuu][Azymlm}xDvu][]}sKnm}x||iY^]}s{{Uu>}|iyyml?|{Uuu][
Azymlm}xDvu][]}sKnm}x||iY^]}s{{Uu>}|iyyml?|{Uuu][Azymlm}xDvu][]}sK
nm}x||iY^]}s{{Uu>}|iyyml?|{Uuu][Azymlm}xd>^QkReH@>L\Mno
>>

# < Checksum: A6013EB5
s NMF3345 f    14.00000 ;Crystal Ref
f   333.00000 ;VCO>
0
*
QP0008* QF2048* G0*
L00064
0101101000111111000010010000100100000100000000100000100010001000010
11110001101001001010100110101100000000000000000*

L00512
110100001010001010001100000000001011011011010000001111110000010000
000000000000000000000000000000000000000000000000000000000000000000
000000000000000000000000000000000000000000000000000000000000000000
000000000000000000000000000000000000000000000000000000000000000000
000000000000000000000000000000000000000000000000000000000000000000
000000000000000000000000000000000000000000000000000000000000000000
000000000000000000000000000000000000000000000000000000000000000000
000000000000000000000000000000000000000000000000000001000000110010
000100000011001000010000001100100001000000011001000010000001100100
010000001100100001000000110010000100000011001000010000001100100001
000000110010000100000011001000010000001100100001000000110010000100
000011001000010000001100100001000000110010000100000011001000010000
001100100001000000110010000100000011001000010000001100100001000000
110100001000000110010000100000011001000010000001100100001000000011
001000010000011001000010000011001000010000011001000010000001100
100001000001100100001000000110010000100000011001000010000011001000
010000011001000010000011001000010000011001000010000011001000010000
0011010000100000011001000010000001100100001000000110010000100000011001000
0100000011001000010000011001000010000011001000010000011001000010000
00110010000100000110010000100000110010000100000110010000100000011
0010001000000110010*
C1C0A*
```

# METHODOLOGY FOR JEDEC FILE REPAIR THROUGH COMPRESSION FIELD TECHNIQUES

FIELD TECHNIQUES

This is a continuation-in-part of application Ser. No. 09/916,453, filed Jul. 27, 2001.

FIELD OF THE INVENTION

The present invention relates to a method and/or architecture for file integrity generally and, more particularly, to JEDEC file integrity and preservation of programming specifications.

BACKGROUND OF THE INVENTION

Files generated in compliance with the Joint Electron Device Engineering Council (JEDEC) standard JESD3-C are used for programming field programmable logic devices. The JESD3-C standard defines a format for transferring fuse or cell states between a development system and a programmer. The files consist of (i) non-programming fields within a design specification portion, (ii) device programming fields, and (iii) a cyclic redundancy check (CRC) portion.

Programming a device starts with presenting parameters defining a program to the development system along with non-programming type information. The development system generates programming items from the parameters. The programming items are then stored in the programmable fields of the file. The non-programmable type information is stored in the non-programming fields of the file.

The JESD3-C standard has several practical limitations. One limitation is that the files cannot be used to reverse calculate the original parameters. A common practice is to dispose of the original device programming parameters once the file has been verified as correct and the programmed devices have gone into production. Consequently, the original intent of the program is lost with the discarding of the parameters. Another limitation is that a corrupted file cannot be repaired.

SUMMARY OF THE INVENTION

The present invention concerns a method of generating a file suitable for programming a programmable logic device. The method generally comprises the steps of (A) generating a programming item from a plurality of parameters that define a program for the programmable logic device; (B) compressing the programming item to present a compressed item; (C) storing the programming item in a programming field of the file in response to generating; and (D) storing the compressed item in a non-programming field of the file in response to compressing.

The objects, features and advantages of the present invention include providing a method and/or architecture for enhanced JEDEC file generation that may (i) preserve the ability to fully recreate the original parameters from the file, (ii) detect a change in bit position/bit values, (iii) substantially reduce tracking through file validation, (iv) preserve input and output frequency parameters, (v) provide full backward compatibility to pre-existing and future JEDEC file readers, and/or (vi) provide for repair of a corrupted file.

BRIEF DESCRIPTION OF THE DRAWINGS

These and other objects, features and advantages of the present invention will be apparent from the following detailed description and the appended claims and drawings in which:

FIG. 2 is an exemplary file created by the present invention;

FIG. 5 is an exemplary listing of data generated by a Huffman encoding;

FIG. 6 is an exemplary file incorporating the compressed item; and

DETAILED DESCRIPTION OF THE PREFERRED EMBODIMENTS

Figure 1:
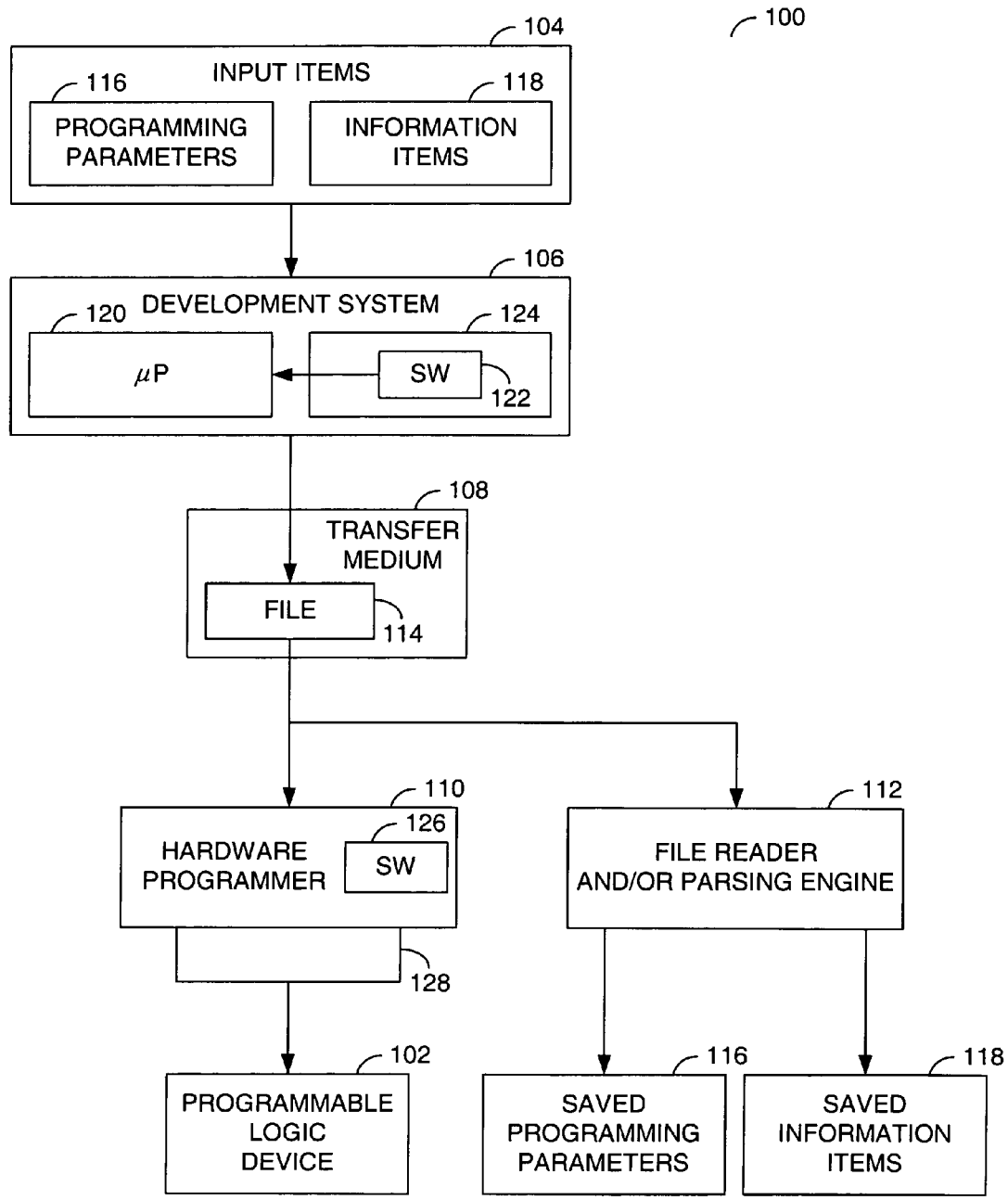
FIG. 1 is a block diagram of a system implementing the present invention.

Referring to FIG. 1, a block diagram of a system 100 is shown in accordance with a preferred embodiment of the present invention. The system 100 may be configured to program a programmable logic device 102 based upon one or more input items 104. The system 100 generally comprises a circuit 106, a transfer medium 108, a circuit 110, and a circuit 112. Other embodiments of the system 100 may include only one of the circuit 110 or the circuit 112. The circuit 106 may be implemented as a development system. The circuit 110 may be implemented as a hardware programmer. The circuit 112 may be implemented as a generic file reader and/or parsing engine. The transmission medium 108 may connect the development system 106 to the hardware programmer 110 and/or the file reader/parsing engine 112 to transfer a file 114.

The development system 106 may be configured to generate the file 114 from the input items 104. The input items 104 may include one or more programming parameters 116. The programming parameters 116 may define a program for configuring the programmable logic device 102. The input items 104 may optionally include one or more information items 118. The information items 118 may be non-programmable data stored in the file 114 for reference purposes. The information items 118 generally do not affect programming of the programmable logic device 102.

The development system 106 may comprise a processor 120 and software 122 residing in a memory 124. The processor 120 may be configured to execute the software 122. The software 122 may instruct the processor 120 to generate the file 114 from the input items 104. The processor 120 may format the file 114 per the Joint Electron Device Engineering Council (JEDEC) standard JESD3-C, hereby incorporated by reference in its entirety. The JESD3-C standard is published by the Electronic Industries Association, Washington, D.C.

The hardware programmer 110 may be controlled by software 126 to program the programmable logic device 102. The programmable logic device 102 may be connected to the hardware programmer 110 through a socket 128 or similar device. The hardware programmer 110 may receive the file 114 from the development system 106 through the transfer medium 108. The hardware programmer 110 may then program or flash the programmable logic device 102 using the programming items stored within the file 114.

The transfer medium 108 may be configured to distribute the file 114 among the development system 106, the hardware programmer 110, and the file reader/parsing engine 112. The transfer medium 108 may be implemented as a serial communication link, a network, a removable medium such as a disk or tape, or the like. Other forms of the transfer medium 108 may be implemented to meet the design criteria of a particular application.

The file reader/parsing engine 112 may be configured to parse the file 114. The parsing may recover the programming parameters 116 and the information items 118 saved as part of the file 114. The recovered items may be useful in determining the original intent of the program defined by the programming parameters 116. The recovered items may also be useful in debugging and/or analyzing the program defined therein.

Referring to FIG. 2, a diagram of an example file 114 implementing the present invention is shown. The file 114 generally adheres to a specific protocol that instructs the hardware programmer 110 on three basic principles. A first section 130 may be a comment section that outlines device identification and other comments. The fields within the first section 130 may be non-programming. A second section 132 may contain programming fields that store addressing information about where to start placing bits. The event of programming generally begins at a first address location and proceeds in a linear fashion until either an end-of-file is reached or a new address is detected. The second section 132 may be passed through a simple cyclic redundancy check (CRC) process and compared against a CRC value stored in a final section 134. The comparison may verify the accuracy of the contents of the file 114.

One or more special comment lines 136 may be included in the first section 130 to store some or all of the programming parameters 116 and the information items 118. In general, the comment lines 136 may comprise one or more lines and/or fields bracketed by delimiters. Existing and future third-party hardware programmers 110, file readers/paring engines 112, and other equipment that may read the file 114 may be compatible the comment lines 136 per the JESDC-3 standard because the comment lines 136 are within the first section 130.

A general format of a first comment line 136 may be given by, "# x Checksum: aaaaaaaa". The field "x" may represent a starting delimiter (e.g., "<"). The field "aaaaaaaa" may be implemented as a non-programming field that may store an error detection item. In one embodiment, the error detection item may be a unique CRC checksum that may be independent from the JESD3-C standard CRC value. The unique CRC checksum may be used by the development systems 106, the hardware programmers 110, the file readers/parsing engines 112, and other equipment to verify the file 114.

A general format of a second comment line 136 may given by "# z bbbbbbbbbb". The field "z" may represent another type of delimiter (e.g., "s"). The field "bbbbbbbbbb" may be implemented as a non-programming field that may store an information item 118. In one embodiment, the delimiter "s" may indicate that the following field "bbbbbbbbbb" may contain a device part number.

A general format of additional comment lines 136 may be given by "# w cccccccccc; dddddddddd". The field "w" may represent another delimiter (e.g., "f"). The field "cccccccccc" may be implemented as a non-programming field that may store a programming parameter 116. The field "dddddddddd" may be implemented as a non-programming field that may store an information item 118. In one embodiment, the delimiter "f" may indicate that the following field "cccccccccc" may contain a frequency used to program the programmable logic device 102. The field "dddddddddd" may contain a comment describing the programming parameter 116 stored in the field "cccccccccc".

A general format of a final comment line 136 may be given by "# w cccccccccc; dddddddddd y". The field "y" may represent an ending delimiter (e.g., ">"). Additional fields and delimiters may be defined within the comment lines 136 to meet the design criteria of a particular application.

The delimiters may be implemented as a character, a symbol, a number, or the like. The delimiters may distinguish the comment lines 136 to the development systems 106, the hardware programmers 110, the file readers/parsing engines 112, and other equipment capable of reading the file 114. In one embodiment, the presence of carriage returns and line feeds between the delimiters may be ignored.

In an example, the programmable logic device 102 may be a programmable multiple phase-lock loop (PLL) device. The following applications may be used for the various fields of the comment lines 136. The "aaaaaaaa" field may store the unique checksum value (e.g., "74F47101") for the file 114. The "bbbbbbbbbb" field may store the device part number (e.g., "NMN3344"). The following fields "cccccccccc" and "dddddddddd" may store frequencies at various interfaces of the programmable logic device 102. In particular, the third comment line 136 may store an external reference frequency. The fourth through last comment lines 136 may store output frequencies for the various PLLs.

Generation of the unique CRC checksum may consist of a series of registers. Starting immediately after the unique CRC checksum field (e.g., the "aaaaaaaa" field) or starting from the second portion 132, the file 114 may be read as an input data stream into a first register sequentially and "clocked" through the series of registers in tandem. Feedback may be provided where values of some registers are feed back to some previous registers. The feedback may be dependent upon coefficients that define a polynomial. Presentation of the input data stream into the generation process may continue until the whole ASCII "binary" bit input data stream has been entered. Once the entire input data stream has been entered, taps from specific registers may be used to generate the unique CRC checksum value.

The accuracy of the generation process generally depends on the number of registers and the coefficients of the polynomial. In one embodiment, there may be 21 stage registers and a predetermined polynomial. The combination of 21 registers and the predetermined polynomial may achieve a detection accuracy to a resolution that may detect a presence of a bit swap(s). Bit swapping may include swapping of position and/or swapping of values. Other combinations of registers and coefficients may be implemented to meet the design criteria of a particular application.

The generation process may be implemented in hardware, firmware, software, micro code, or any combination of hardware, firmware, software and micro code. The following is an example of a unique CRC checksum generation process implemented as a software program having 21 registers and a polynomial having all initial coefficients set to zero. The input data stream may be represented by an array[s]. The example code may be:

```
void SONOS::calculateChecksum(int tempEnd, char array[], char
checksum[])
{
    unsigned short reg[21];
    unsigned short temp;
    int j = 20;
    for (int k = 0; k < 21; k++)
    {
        reg[k] = 0;
    }
    temp = reg[20];
    // There are 21 registers to store polynomial coefficients
    // and 7 adders to calculate unique CRC checksum in this process
    for (int s = 0; s < tempEnd; s++)
    {
        reg[0] = array[s] + temp;
        reg[3] = reg[2] + temp;
        reg[6] = reg[5] + temp;
        reg[9] = reg[8] + temp;
        reg[12] = reg[11] + temp;
        reg[15] = reg[14] + temp;
        reg[18] = reg[17] + temp;
        temp = reg[20];
        // Shifting registers
        for (int j = 20; j > 0; j--)
        {
            reg[j] = reg[j-1];
        }
    }
    int tempCurrent = 0;
    tempCurrent += sprintf (checksum + tempCurrent, "%4X%4X",
reg[15], reg[10]);
    checksum[tempCurrent] = '\0';
}
```

Other unique CRC checksum generation processes may be implemented to meet the design criteria of a particular application.

Figure 3:
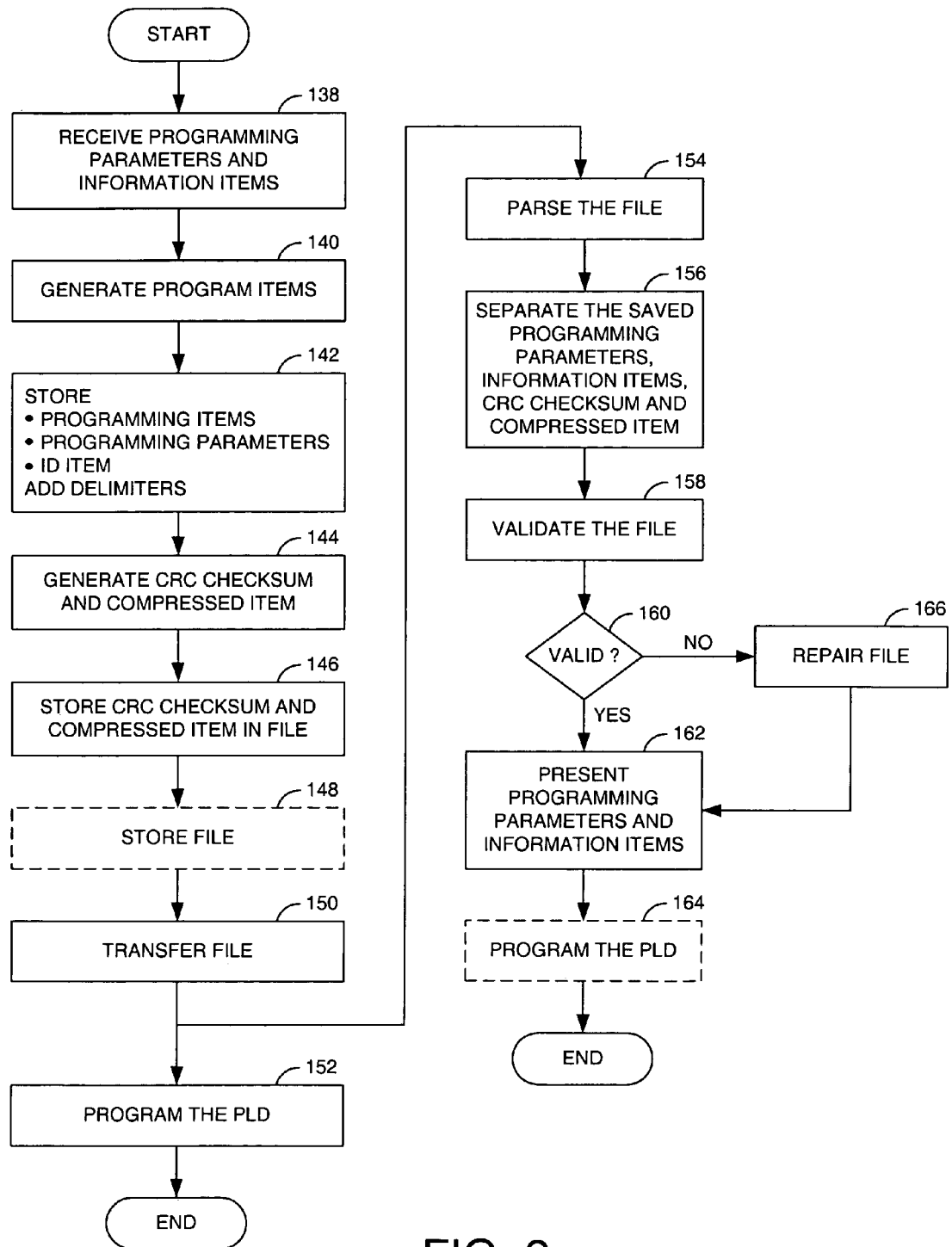
FIG. 3 is a flow diagram of a process for generating and using a modified JEDEC file.

Referring to FIG. 3, a flow diagram of a method of generating and using the file 114 is shown. The process may begin with reception of the programming parameters 116 and the information items 118 by the development system 106 (e.g., block 138). The processor 120 may then generate the programming items from the programming parameters 116 (e.g., block 140). The processor 120 may store, in no particular order, (i) the programming items in the programmable fields, (ii) selected programming parameters 116 in the non-programming fields of the comment lines 136, (iii) the identification item in a non-programming field of the comment lines 136, and (iv) add the starting delimiter and the ending delimiter to the comment lines 136 (e.g., block 142).

Once the processor 120 has generated the second portion 132 of the file 114, the processor 120 may generate the unique CRC checksum and a compressed item (e.g., block 144). The compressed item may be used to repair the file 114 if corrupted, as described later. The unique CRC checksum and the compressed item may be stored in non-programmable fields of the comment lines 136 (e.g., block 146). Optionally, the completed file 114 may be stored within the development system 106 for later transmission (e.g., block 148).

To program a programmable logic device 102, the file 114 may be transferred from the development system 106 to the hardware programmer 110 (e.g., block 150). The hardware programmer 110 may then use the second portion 132 of the file 114 to flash the program into the programmable logic device 102 (e.g., block 152). Programming may then be repeated with additional programmable logic devices 102 using the same file 114.

To recover the saved programming parameters 116, identification items 118, the unique CRC checksum and/or the compressed item, the file 114 may be transferred to the file reader/parsing engine 112 (e.g., block 150). The file reader/parsing engine 112 may parse the file 114 using the delimiters to extract the comment line or lines 136 (e.g., block 154). The comment lines 136 may then be separated by the fields into the identification items 118, the programming parameters 116, the unique CRC checksum and the compressed item (e.g., block 156).

The file 114 may then be validated against the unique CRC checksum (e.g., block 158). If the file 114 passes the validation (e.g., the YES branch of decision block 160), then the extracted programming parameters 116 and identification items 118 may be presented for display (e.g., block 162). In situations where the file reader/parsing engine 112 also has a programming capability, then the validated second portion 132 of the file 114 may be used to program the programmable logic device (e.g., block 164). If the file 114 fails the validation (e.g., the NO branch of decision block 160), then a file repair process may be performed (e.g., block 166).

The file repair process may use the compressed item to create a new or backup copy of at least the programming items. The compressed item may also be used to create a new or backup copy of some or all of the information items and/or programming parameters. The compressed item may exclude the unique CRC checksum.

Figure 4:
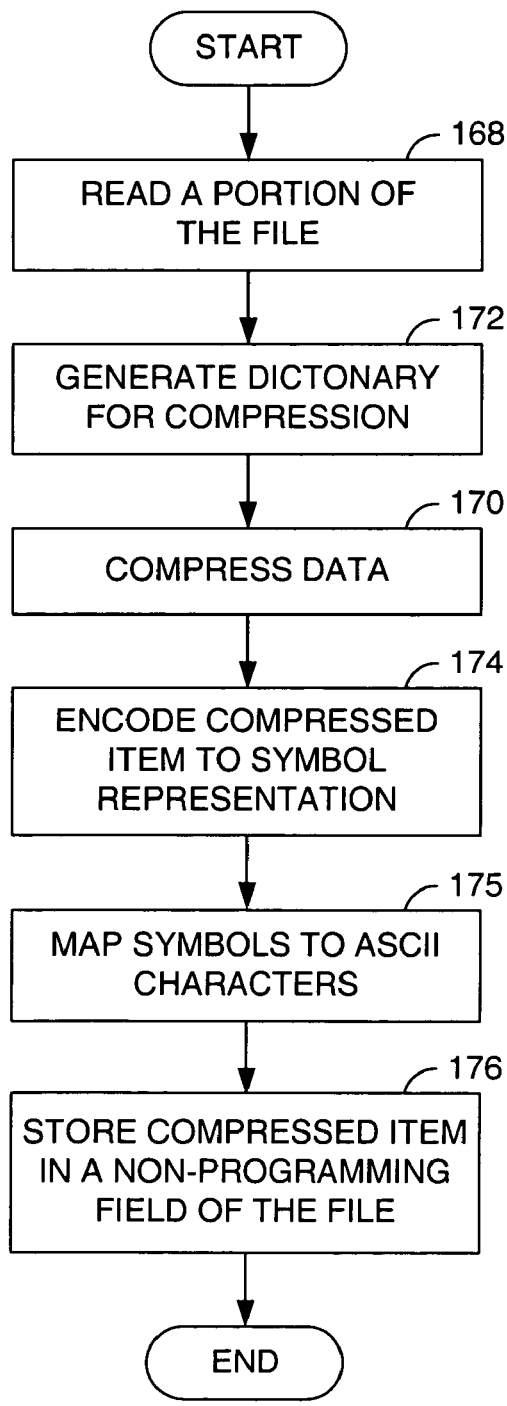
FIG. 4 is a flow diagram of a process for generating a compressed item for inclusion in the modified JEDEC file.

Referring to FIG. 4, a flow diagram of a process for generating the compressed item for inclusion in the file 114 is shown. The process may begin by reading a portion of the file 114 (e.g., block 168). The portion generally starts from the comment line 136 immediately following the unique CRC checksum or from the second portion 132 to the end of the file 114.

The portion of the file 114 may be read as an input data stream into a compression process. The compression process may be implemented a Huffman encoding process. The Huffman encoding process may provide an effective compression for the entropy presented by the mean or average format type of the JEDEC file specification. The Huffman encoding may provide an overall process that may be deterministic by nature and noiseless in a default state. Other compression methodologies may be implemented to meet the design criteria of a particular application.

The Huffman encoding generally involves a dictionary for encoding/decoding. The dictionary for the Huffman encoding and Huffman decoding may be referred to as a Huffman tree or binary tree. The Huffman encoding generally creates the Huffman tree as part of the process. Since the Huffman tree may be required for decoding, the Huffman tree is commonly incorporated in the resulting compressed item.

The development system 106 may execute the Huffman encoding process to generate the compressed item (e.g., block 170). To help minimized a size of the compressed item, the development system 106 may generate the Huffman tree (e.g., block 172) independently of the Huffman encoding process. As a result, a need to incorporate the Huffman tree into the compressed item may be eliminated. The following is an example of a Huffman encoding process implemented as a software program. The example code may be:

```cpp
// Header file of Huffman encoder : Imported from "The Data
// Compression Book, 2nd Edition" by Mark Nelson & Jean-loup Gailly
// This information regarding implementing the process specifics
// is subject to copyright © for the public domain Huffman encoding
// section only.
class huffman
{
public:
    huffman();
    virtual ~huffman();
public:
    char *CompressionName;
    char *Usage;
    int input_stream;
    int output_stream;
    unsigned long *counts;
    NODE *nodes;
    CODE *codes;
    char *printOut;
    void count_bytes( char *input, unsigned long *long_counts );
    void scale_counts( unsigned long *long_counts, NODE *nodes );
    int build_tree( NODE *nodes );
    void convert_tree_to_code( NODE *nodes,
                    CODE *codes,
                    unsigned int code_so_far,
                    int bits,
                    int node );
    void output_counts( char *output, NODE *nodes );
    void input_counts( char *input, NODE *nodes );
    void print_model( NODE *nodes, CODE *codes );
    void compress_data( char *input, char *output, CODE *codes );
    char *expand_data( char *input, char *output, NODE *nodes,
                    int root_node );
    void print_char( int c );
    void CompressFile( char *input, char *output, int argc, char
                    *argv);
    char *ExpandFile( char *input, char *output, int argc, char
                    *argv, NODE *nodes);
    void int2Bin( char* buffer, unsigned int code, int bits );
    void OutputBits( char *bit_file, unsigned long code,
                    int count );
    int InputBit( char *bit_file, int index );
};
/*Function definition of build Huffman binary tree */
int huffman::build_tree( NODE *nodes )
{
    int next_free;
    int i;
    int min_1;
    int min_2;
    nodes[ 513 ].count = 0xffff;
    for ( next_free = END_OF_STREAM + 1 ; ; next_free++ ) {
        min_1 = 513;
        min_2 = 513;
        for ( i = 0 ; i < next_free ; i++ )
            if ( nodes[ i ].count != 0) {
                if ( nodes[i].count < nodes[min_1].count ) {
                    min_2 = min_1;
                    min_1 = i;
                }else if (nodes[i].count < nodes[min_2].count)
                    min_2 = i;
            }
        if ( min_2 == 513 )
            break;
        nodes[ next_free ].count = nodes[ min_1 ].count
                        + nodes[ min_2 ].count;
        nodes[ min_1 ].saved_count = nodes[ min_1 ].count;
        nodes[ min_1 ].count = 0;
        nodes[ min_2 ].saved_count = nodes[ min_2 ].count;
        nodes[ min_2 ].count = 0;
        nodes[ next_free ].child_0 = min_1;
        nodes[ next_free ].child_1 = min_2;
    }
    next_free--;
    nodes[ next_free ].saved_count = nodes[ next_free ].count;
    return( next_free );
}
/* Function definition of CompressFile
 * The function changes to "malloc" to memory instead of the
 * default file I/O routine specified in the original process.
 */
void huffman::CompressFile(char *input, char *output, int argc,
char *argv )
{
    unsigned long *counts;
    CODE *codes;
    int root_node;
    counts = (unsigned long *) calloc(256, sizeof(unsigned long) );
    if ( counts == NULL )
        AfxMessageBox( "Error allocating counts array\n" ) ;
    if ( ( nodes = (NODE *) calloc(514, sizeof( NODE ) ) ) == NULL)
        AfxMessageBox( "Error allocating nodes array\n" ) ;
    if ( ( codes = (CODE *) calloc(257, sizeof(CODE) ) ) == NULL )
        AfxMessageBox( "Error allocating codes array\n" );
    // Construct Huffman binary tree
    count_bytes( input, counts );
    scale_counts( counts, nodes );
    root_node = build_tree( nodes );
    convert_tree_to_code( nodes, codes, 0, 0, root_node );
        int child1=nodes[293].child_1;
    if ( strcmp( argv, "-d" ) == 0 )
        print_model( nodes, codes );
    // Function call for outputting the stream of Huffman code to
    // string
    compress_data( input, output, codes );
    printOut = ExpandFile( output, printOut, argc, argv, nodes );
    free( (char *) counts );
    free( (char *) nodes );
    free( (char *) codes );
}
/*Function definition of compress_data
 *
 * Once the tree gets built, and the CODE table is built,
 * compressing the data is simple. Each byte is read in, and a
 * corresponding Huffman code is sent out.
 */
void huffman::compress_data(char *input, char *output, CODE *codes)
{
    int c;
    char buffer[20];
    while ( ( c = input[input_stream++] ) != '\0' )
    {
        sprintf(buffer, "");
        int2Bin( buffer, (unsigned long) codes[ c ].code,
                    codes[ c ].code_bits );
        strcat(output, buffer);
    }
    sprintf(buffer, "");
    int2Bin( buffer, (unsigned long) codes[ END_OF_STREAM ].code,
                codes[ END_OF_STREAM ].code_bits );
    strcat(output, buffer);
}
/* Function definition of convert_tree_to_code
 */
void huffman::convert_tree_to_code( NODE *nodes, CODE *codes,
unsigned int code_so_far, int bits, int node )
{
    if ( node <= END_OF_STREAM ) {
        codes[ node ].code = code_so_far;
        codes[ node ].code_bits = bits;
        return;
    }
    code_so_far <<= 1;
    bits++;
    convert_tree_to_code( nodes, codes, code_so_far, bits,
                    nodes[ node ].child_0 );
    convert_tree_to_code( nodes, codes, code_so_far | 1,
                    bits, nodes[ node ].child_1 );
}
```

The resulting compressed item may present a binary representation of the compressed data. Since the compressed item may be inserted into one or more comment lines 136 in the first section 130 of the file 114, the compressed item may be encoded into a more suitable format (e.g., block 174). In general, the encoding may convert the compressed item from the binary representation to a symbol representation and then to a character representation.

The encoding to the symbol representation may be implemented as a Base 64 encoding. The Base 64 encoding may convert binary data into symbols. In particular, the Base 64 encoding may allow every six bits of binary data to be represented as a single symbol. The Base 64 encoding may result in additional compression (e.g., ⅙th) representation of the compressed item as stored in the file 114 due to the $2^6$ symbol size. The Base 64 encoding may result in a high base or a highest base for a printable character symbols set for an ASCII file.

The symbols may then be mapped into an ASCII character representation (e.g., block 175) that may be viewed and printed inside the file 114. Symbol base representation may be handled directly through fixed tables inside the development system 106. The fixed tables may help minimize a size overhead requirement of the resulting compressed item.

The compressed item in the ASCII character format may then be stored in the first section 130 of the file 114 (e.g., block 176). The following is an example of a Base 64 encoding process implemented as a software program. The example code may be:

```
/* Header file for base 64 compression
Take the raw Huffman output and convert the contents to base 64
mapping such that all information can now be viewable, and/or
printable.
*/
class base64
{
public:
    char *Dec2Bin(unsigned short dec, int bits);
    void deCompress(char *input, char *output);
    base64();
    virtual ~base64();
    void bin2Dec(char *array);
    void compress64(char *input, char *output);
    int base64ConvertedValue;
    char base64Array[65];
};
// base64 class Constructor : The ASCII table construction happens
// here
base64::base64()
{
    // ASCII table construction
    // 64 ASCII character were chosen and base64Array holds all
    // characters
    int j = 62;
    int i = 0;
    for (int k = 1; k < 65; k++)
    {
        i += sprintf(base64Array + i, "%c", j);
        j ++;
    }
    base64Array[64] = '\0';
}
/* Base 64 compress function definition
 * Take the raw Huffman output and convert the contents to base 64
 * mapping such that all information can now be viewable, and/or
 * printable.
 */
void base64::compress64(char *input, char *output)
{
    long inputLength = strlen(input);
    double remainder;
    int chop;
    double f1;
    int intRmdr;
    int belowDecimal;
    if (inputLength % 6)
    {
        remainder = (double)((double)inputLength / 6);
        chop = (int)remainder;
```

-continued

```
        f1 = (double)(remainder - chop);
        intRmdr = (int)(f1 * 6);
        belowDecimal = 6 - intRmdr;
        for (int k=inputLength; k<inputLength+belowDecimal; k++)
            input[k] = '0';
        output[inputLength/6] = '\0';
        for (int i = 0; i < inputLength/6; i++)
        {
            bin2Dec(input);
            output[i] = base64Array[base64ConvertedValue];
            input = input + 6;
        }
    }
    else
    {
        output[inputLength/6] = '\0';
        for (int i = 0; i < inputLength/6; i++)
        {
            bin2Dec(input);
            output[i] = base64Array[base64ConvertedValue];
            input = input + 6;
        }
    }
}
```

Referring to FIG. 5, an exemplary listing of data 178 generated by a Huffman encoding is shown. The data 178 may be shown in FIG. 5 as an ASCII binary representation for ease of presentation. The data 178 in a pure binary form may have a smaller size (e.g., ⅛th) what is shown in FIG. 5.

Referring to FIG. 6, an exemplary file 114A incorporating the compressed item is shown. The file 114A may comprise the first (non-programming) section 130, the second (programming) section 132 and the final (CRC) section 134. Multiple comment lines 136A may be provided for within the first section 130.

The compressed item may be stored in one or more comment lines 136A within the first section 130. In one embodiment, the compressed item may be positioned before the unique CRC checksum. Positioning the compressed item before the unique CRC checksum may alleviate a potential deadlock situation by keeping the processing elements mutually exclusive. Other position arrangements of the compressed item within the first section 130 may be implemented to meet the design criteria of a particular application. The compressed item shown in FIG. 6 may be generated from the Huffman encoded data shown in FIG. 5.

A general format of a first comment line 136A may be given by, "Compression ID vv". The field "vv" may represent a starting delimiter (e.g., "<<"). A second comment line 136A may be given by, "eee . . . eee". The field "eee . . . eee" may be implemented as a non-programming field that stores the first several characters of the compressed item. Additional comment lines 136A may also provide additional fields "eee . . . eee" as necessary to store additional characters of the compressed item. Another comment line 136A may be given by, "uu". The field "uu" may represent an ending delimiter (e.g., ">>"). Additional fields and delimiters may be defined within the comment lines 136A to meet the design criteria of a particular application.

The delimiters within the comment lines 136A may be implemented as characters, symbols, numbers, or the like. The delimiters may distinguish the comment lines 136A to the development systems 106, the hardware programmers 110, the file readers/parsing engines 112, and other equipment capable of reading the file 114A. In one embodiment, the presence of carriage returns and line feeds between the delimiters may be ignored.

As with the file 114, the file 114A may be transferred among the development system 106, the hardware programmer 110 and/or the file reader/parsing engine 112 via the transfer medium 108. Since the compressed item may be stored in the first section 130 of the file 114A, conventional hardware programmers 110 may accept and use the file 114A for programming the programmable logic devices 102. The conventional hardware programmers 110 may treat the compressed item as a non-programming comment.

The file reader/parsing engine 112 and/or the development system 106 may be configured to parse, separate, decode and decompress the compressed item from the file 114A as necessary. In general, the file reader/parsing engine 112 and the development system 106 may parse the compressed item while parsing the file 114A (e.g., block 154 of FIG. 3). The decoding and decompression of the compressed item may be performed as part of the file repair process (e.g., block 166 of FIG. 3).

Figure 7:
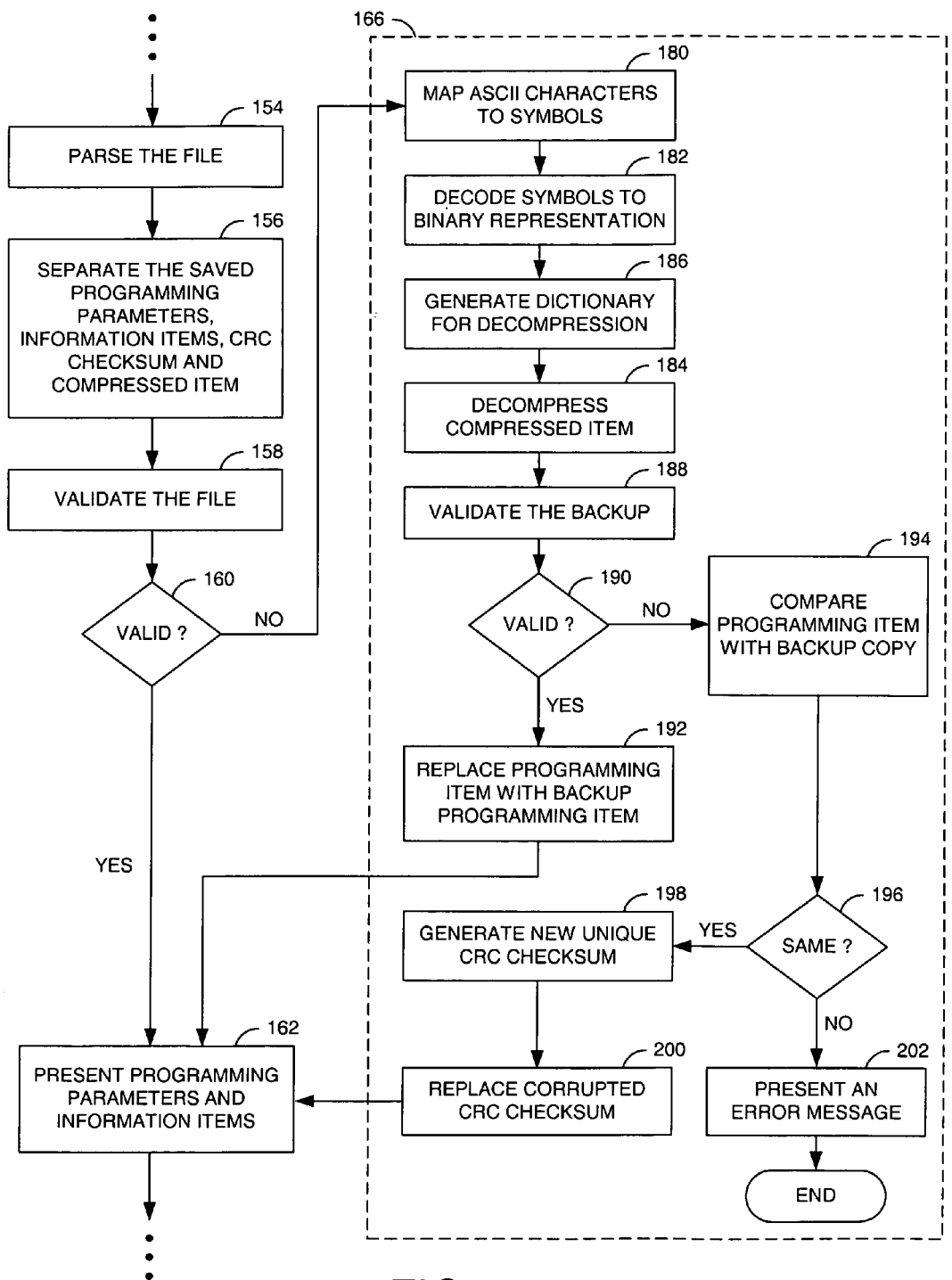
FIG. 7 is a flow diagram of a process for repairing a corrupted file.

Referring to FIG. 7, a flow diagram of a process for repairing a file 114A that has been corrupted is shown. Prior to the file repair 166, the parsing of the file 114A may be performed using the delimiters to extract the comment lines 136A (e.g., block 154). The comment lines 136A may then be separated or extracted by the fields into the identification items 118, the programming parameters 116, the unique CRC checksum and the compressed item (e.g., block 156). After the validation of the file 114A (e.g., block 158) has failed (e.g., the NO branch of decision block 160), the file repair (e.g., 166) may be initiated.

The file repair 166 may begin by mapping the ASCII character representation of the compressed item back into the symbol representation (e.g., block 180). The mapping of the ASCII characters to the symbols may be performed through fixed tables. The symbol representation of the compressed item may then be decoded back into the binary representation (e.g., block 182).

The decoding may be implemented as a Base 64 decoding. The Base 64 decoding may convert the symbols into binary data. For example, the Base 64 decoding may convert each symbol into six bits of binary data. The following is an example of a Base 64 decoding process implemented as a software program. The example code may be:

```
/* Base 64 decompress function definition
 * Take the JEDEC file input and convert the contents from base 64
 * mapping.
 */
void base64::decompress(char *input, char *output)
{
    char temp[50000];
    int length = strlen(input);
    sprintf(temp, "");
    for (int i = 0; i < length; i++)
    {
        strcat(temp, Dec2Bin((int)input[i] - 62, 6));
    }
    strcpy(output, temp);
}
```

A decompression of the compressed item (e.g., block 184) may be performed after the compressed item has been decoded into the binary representation. The decompression may present a new or backup copy of the programming items and any non-programming items included in the compression process. The decompression process may be implemented as a Huffman decoding process. Other decompression methodologies may be implemented to meet the design criteria of a particular application.

The Huffman decoding generally requires the dictionary or Huffman tree to achieve a deterministic result. If the Huffman tree was incorporated into the compressed item, then the Huffman tree may be extracted from the compressed item for use in decompression. If the Huffman tree was not incorporated into the compressed item, then the system developer 106 and/or file reader/parsing engine 112 may generate the Huffman tree (e.g., block 186) prior to the actual decompression. The following is an example of a Huffman decoding process implemented as a software program. The example code may be:

```
/*
 * Expanding compressed data. Imported from "The Data Compression
 * Book, 2nd Edition" by Mark Nelson & Jean-loup Gailly. This
 * information regarding implementing the process specifics is
 * subject to copyright © for the public domain Huffman decoding
 * section only. As each new symbol is decoded, the tree is
 * traversed, starting at the root node, reading a bit in, and
 * taking either the child_0 or child_1 path. Eventually, the
 * tree winds down to a leaf node, and the corresponding symbol is
 * output. If the symbol is the END_OF_STREAM symbol, it doesn't
 * get written out, and instead the whole process terminates.
 */
char *huffman::expand_data( char *input, char *output, NODE *nodes,
                            int root_node )
{
    int node;
    int index = 0;
    char tempOut[2];
    char tempOutput[50000];
    sprintf(tempOutput, "");
    for ( ; ; ) {
        node = root_node;
        do
        {
            if (input[index] == '1')
                node = nodes[ node ].child_1;
            else
                node = nodes[ node ].child_0;
            index++;
        } while ( (node > END_OF_STREAM) );
        if ( node == END_OF_STREAM )
            break;
        sprintf(tempOut, "%c", node);
        tempOut[1] = '\0';
        strcat(tempOutput, tempOut);
    }
    output = &tempOutput[0];
    return output;
}
```

The programming items and non-programming items, if any, resulting from the decompression may be validated (e.g., block 188). The validation may use the unique CRC checksum as originally stored within the file 114A. If the validation is successful (e.g., the YES branch of decision block 190), then the backup copy of the programming items and any non-programming items may be used to replace (e.g., block 192) the original programming items and original non-programming items that failed the initial validation (e.g., block 158 of FIG. 3). After the replacement has completed, the corrupted file 114A may then be considered repaired and the file repair 166 complete. Processing may then continue with the steps of presenting the programming parameters and information items (e.g., block 162) and programming of the programmable logic device (e.g., block 164 of FIG. 3).

If the validation is not successful (e.g., the NO branch of decision block 190), then another comparison may be performed. The programming items from the second section 132 of the file 114A may be compared against the backup copy of the programming items extracted from the compressed item (e.g., block 194). If the programming items and the backup copy of the programming items are the same (e.g., the YES branch of decision block 196), then the validation failures of the programming items (e.g., block 158) and the backup copy (e.g., block 188) may be due to a corrupted unique CRC checksum.

A new unique CRC checksum may then be generated based upon the file 114A (e.g., block 198). The new unique CRC checksum may then replace the corrupted unique CRC checksum (e.g., block 200) to repair the file 114A. After the replacement has completed then the file repair 166 process may be complete. Processing may continue with the steps of presenting the programming parameters and information items (e.g., block 162) and programming of the programmable logic device (e.g., block 164 of FIG. 3).

If the comparison fails (e.g., the NO branch of decision block 196), then an extent of the corruption may be uncertain. Therefore, a repair of the file 114A may not be possible. The user may be alerted with an error message (e.g., block 202) and processing ended.

The function performed by the flow diagrams of FIGS. 3, 4 and 7 may be implemented using a conventional general purpose digital computer programmed according to the teachings of the present specification, as will be apparent to those skilled in the relevant art(s). Appropriate software coding can readily be prepared by skilled programmers based on the teachings of the present disclosure, as will also be apparent to those skilled in the relevant art(s).

The present invention may also be implemented by the preparation of ASICs, FPGAs, or by interconnecting an appropriate network of conventional component circuits, as is described herein, modifications of which will be readily apparent to those skilled in the art(s).

The present invention thus may also include a computer product which may be a storage medium including instructions (or computer program) which can be used to program a computer to perform a process in accordance with the present invention. The storage medium can include, but is not limited to, any type of disk including floppy disk, optical disk, CD-ROM, and magneto-optical disks, ROMs, RAMs, EPROMs, EEPROMs, Flash memory, magnetic or optical cards, or any type of media suitable for storing electronic instructions.

While the invention has been particularly shown and described with reference to the preferred embodiments thereof, it will be understood by those skilled in the art that various changes in form and details may be made without departing from the spirit and scope of the invention.

The invention claimed is:

1. A method of generating a file suitable for programming a programmable logic device, the method comprising the steps of:
   (A) generating a programming item from a plurality of parameters that define a program for said programmable logic device;
   (B) compressing said programming item to present a compressed item;
   (C) storing said programming item in a programming field of said file;
   (D) storing said compressed item in a plurality of first non-programming fields of said file;
   (E) storing at least one non-programming type information item in a second non-programmable field of said file;
   (F) generating an error detection item;
   (G) storing said error detection item in a third non-programming field of said file;
   (H) extracting said error detection item and said compressed item from said file; and
   (I) decompressing said compressed item to present a backup programming item, wherein said decompressing includes mapping said compressed item from a character representation to a symbol representation.

2. The method according to claim 1, further comprising the step of storing at least one of said parameters in a fourth non-programming field of said file.

3. The method according to claim 1, further comprising the step of generating a dictionary for compressing prior to compressing said programming item.

4. The method according to claim 3, wherein said dictionary is generated independently of said compressing step.

5. The method according to claim 4, wherein said compressing is a Huffman encoding and said dictionary is a Huffman tree.

6. The method according to claim 1, further comprising the step of encoding said compressed item from a binary representation to a symbol representation in response to compressing.

7. The method according to claim 6, further comprising the step of mapping said symbol representation to a character representation in response to encoding.

8. The method according to claim 1, wherein said steps (A) through (I) are stored in a storage medium as a computer program that is readable and executable by a computer to generate said file.

9. The method according to claim 1, further comprising the step of adding a plurality of delimiters around said compressed item in a plurality of fourth non-programming fields.

10. The method according to claim 1, wherein said file is compatible with a Joint Electron Device Engineering Council JESD3-C standard.

11. The method according to claim 1, wherein said step of decompressing said compressed item further comprises the sub-step of decoding said compressed item from said symbol representation to a binary representation in response to mapping.

12. The method according to claim 1, wherein said step of extracting said compressed item comprises the sub-step of parsing a plurality of comments lines containing said compressed item from said file using a plurality of delimiters.

13. The method according to claim 1, wherein said step of extracting said error detection item comprises the sub-step of parsing at least one comment line containing said error detection item from said file using a plurality of delimiters.

14. The method according to claim 1, further comprising the step of:
   validating said backup programming item with said error detection item.

15. The method according to claim 14, further comprising the step of extracting said programming item from said programmable field of said file.

16. The method according to claim 15, further comprising the step of replacing said programming item with said backup programming item in response to validating said backup programming item.

17. The method according to claim 14, further comprising the step of repairing said error detection item in response to said backup programming item failing said validating step.

18. An apparatus comprising:
- means for transferring a file; and
- means for (i) generating a programming item from a plurality of parameters that define a program for a programmable logic device, (ii) compressing said programming item to present a compressed item, (iii) storing said programming item in a programming field of said file, (iv) storing said compressed item in a plurality of non-programming fields of said file, (v) storing at least one non-programming type information item in a second non-programmable field of said file, (vi) generating an error detection item, (vii) storing said error detection item in a third non-programming field of said file, (viii) extracting said error detection item and said compressed item from said file, and (ix) decompressing said compressed item to present a backup programming item, wherein said decompressing includes mapping said compressed item from a character representation to a symbol representation.

* * * * *